United States Patent [19]

Short

[11] 3,876,433

[45] Apr. 8, 1975

[54] BISMUTH-CONTAINING SILVER CONDUCTOR COMPOSITIONS

[75] Inventor: Oliver Alton Short, Wilmington, Del.

[73] Assignee: E. I. du Pont de Nemours and Company, Wilmington, Del.

[22] Filed: Dec. 28, 1973

[21] Appl. No.: 429,078

[52] U.S. Cl. .................................... 106/1; 117/227

[51] Int. Cl. ................................................ C09d 5/00

[58] Field of Search .......................... 106/1; 117/227

[56] References Cited

UNITED STATES PATENTS 3,401,126 9/1968 Miller et al. ........................ 106/1 X 3,545,986 12/1970 Short ........................................ 106/1

*Primary Examiner*—Lewis T. Jacobs

[57] ABSTRACT

Improved silver conductor compositions comprising, in addition to silver and inorganic binder (such as glass and $Bi_2O_3$), bismuth, whereby the solder leach resistance of resultant conductors is enhanced. The bismuth may be present as finely divided metallic bismuth, or as a finely divided Ag/Bi coprecipitated powder. Also, dispersions thereof in inert vehicle and ceramic substrates having the conductor composition in adherent relationship therewith.

8 Claims, No Drawings

BISMUTH-CONTAINING SILVER CONDUCTOR COMPOSITIONS

BACKGROUND OF THE INVENTION

Metallizing compositions or paints used in metallizing ceramic surfaces for electrical purposes must be fired on the surfaces at a temperature sufficiently high to produce good adhesion, good capacitance and a low dissipation factor. In addition, the fired-on metallizations must be readily solderable to electrical lead wires or other metallic connectors (i.e., have solder wettability); the metallizations must have good solder leach resistance when exposed to molten solder. Especially desireable are such conductor compositions which can withstand longer residence in a molten solder bath. The lead-containing noble metal compositions of U.S. Pat. No. 3,679,439, issued July 25, 1972, are improved over compositions containing no lead, but further improvement in solder leach resistance is needed in commercial conductors.

SUMMARY OF THE INVENTION

In compositions comprising finely divided silver and inorganic binder, useful for producing conductive patterns on a dielectric substrate, this invention provides improved compositions additionally comprising bismuth, as finely divided elemental bismuth powder or as finely divided silver/bismuth coprecipitated powder, the amount of bismuth being an amount effective to increase the solder leach resistance of conductors thereof.

Often the compositions of this invention will comprise 2–20% by weight bismuth, based on the weight of silver. Also a part of this invention are dispersions of such compositions in an inert liquid vehicle, and ceramic dielectric substrates having the conductor composition in adherent relationship thereto, that is, the compositions are sintered (fired) to form an electrically continuous pattern on the substrate.

DETAILED DESCRIPTION

The silver metallizing compositions in which I have made an improvement have varying silver contents, depending upon the desired resultant electrical properties. Furthermore, the percent solids (metals and inorganic binder) in the metallizing composition can be modified to suit the particular application which is involved. Metallizing compositions generally are of such a particle size that they can be applied by screen printing techniques. Typically, the inorganic powders (solids) metallizing compositions, including those of this invention, are of a size small enough to pass through a screen in the size range No. 200-No. 400 (U.S. standard sieve scale), as indicated in the art, e.g., Miller U.S. Pat. No. 3,374,110.

The metallizing compositions contain an inorganic binder. Any inorganic material which serves to bind metals to the substrate and to one another can be used as the inorganic binder. The amount of inorganic binder present should always be sufficient to provide adequate adhesion of the metals to the substrate. The inorganic binder can be any of the glass frits employed in metallizing compositions. Such frits are generally prepared by melting a glass batch of desired metal oxides, or compound which will produce the glass during melting, and pouring the melt into water. The coarse frit is then milled to a powder of the desired fineness.

The patents to Larsen and Short, U.S. Pat. No. 2,822,279, and to Hoffman, U.S. Pat. No. 3,207,706, describe some frit compositions which can be employed. Typical frit compositions usable as binders in the compositions of this invention include: lead borate, lead silicate, lead borosilicate, cadmium borate, lead-cadmium borosilicate, zinc borosilicate and sodium-cadmium borosilicate frits. The glass frit may be used alone, or together with a wetting agent such as $Bi_2O_3$. It is pointed out that the presence of the additives of the present invention may eliminate the need for a wetting agent. Consequently, a wetting agent is an optional constituent in the metallizing compositions of this invention.

The essential feature of the present invention is the incorporation in such silver compositions of bismuth, either as the element or as Ag/Bi coprecipitate. The amount of bismuth employed, in either form, is an amount effective to increase the solder leach resistance of the resultant conductor pattern adherent to a ceramic dielectric substrate. Such conductor patterns are made adherent to the substrate by firing (sintering) the composition at a temperature below the melting point of silver. Normally, there is at least 2% bismuth present, based on silver, to cause an appreciable increase in solder leach resistance, but normally not more than 20%, due to oxidation of bismuth during firing and consequent reduced solderability. This 2–20% limitation on bismuth is for purposes of practicality only, and not of the essence of my invention.

It is obvious that bismuth may be present in a given powder composition as both the element and the coprecipitate, if so desired. The amount of bismuth in the coprecipitate is therefore simply a matter of choice, although it will often be in the range 10–90% of the weight of the coprecipitate powder.

Coprecipitation may be conducted by the techniques of Short U.S. Pat. No. 3,620,714, issued Nov. 16, 1971, or Hoffman U.S. Pat. No. 3,390,981, issued July 2, 1968; that is, by coreduction of salts of the respective metals from an aqueous solution, using as the reductant a material capable of reducing both metals simultaneously. Preferred reductants include formaldehyde, hydrazine and its salts, hypophosphates, formic acid and formates. Numerous reducing agents are capable of reducing silver ions, but bismuth ions are more difficult to reduce. Mixed reducing agents, capable of precipitating each metal salt essentially completely, may be used.

The metallizing compositions of this invention will usually, althougn not necessarily, be dispersed in an inert liquid vehicle to form a paint or paste for application to ceramic dielectric substrates. The proportion of vehicle to solids may vary considerably upon the manner in which the paint or paste is to be applied and the kind of vehicle used. Any liquid, preferably one that is inert towards the noble metal and inorganic binder, may be employed as the vehicle. Water or any of the various organic liquids, with or without resin binders, thickening and/or stabilizing agents, and/or other common additives may be utilized as the vehicle. Examples of organic liquids that can be used are esters or higher alcohols, for example, the acetates and propionates; the terpenes such as pine oil, terpineol and the like; and solutions of resin binders such as the polymethacrylates of lower alcohols, or solutions of ethyl cellulose, and solvents such as pine oil and the monobutyl ether of ethylene glycol monoacetate (butyl—O—$CH_2CH_2$—$OCOCH_3$). Vehicles disclosed in U.S. Pat. No. 3,536,508, issued Oct. 27, 1970, may be used. The vehicle may contain or be composed of volatile liquids to promote fast setting after application, or it may contain waxes, thermoplastic resins or the like materials which are thermofluid so that the vehicle-containing composition may be applied at an elevated temperature to a relatively cold ceramic body upon which the composition sets immediately.

The metallizing compositions can be applied and fired onto various types of ceramic dielectrics, including those composed of forsterite, steatite, titanium oxide, barium titanate, alumina or zircon porcelain. Any other conventional unfired (green) dielectrics or prefired dielectrics can be used. The metallizing compositions can be applied by any of the conventional techniques, including screen printing, brushing, brush/-band, spraying or dipping.

Conventional thick-film techniques commonly employed are described in "Handbook of Materials and Processes for Electronics," C.A. Harper, editor, McGraw-Hill, N.Y., 1970, Chapter 12. The invention is further illustrated by the following examples. In the examples and elsewhere in the specification all parts, ratios and percentages of material or components are by weight.

EXAMPLE 1

As a comparative showing, a composition containing 50% silver powder, 2¼% of a cadmium borosilicate frit, 9% bismuth oxide and 38¾% organic vehicle (10% ethyl cellulose and 90% pine oil) was printed on one-half-inch diameter capacitor wafers. Two standard types of ceramic wafers were used, one composed mostly of barium titanate and the other mostly of titania. The printed wafers were then fired in a belt furnace at 760°C. for 45 minutes, 10 minutes at peak temperature. These fired wafers were then dipped in a solder bath containing 62% tin, 36% lead, 2% silver, held at a temperature of 215°C.±1°. The time to leach the silver pattern from the ceramic chip, to such a degree that solder would no longer wet the printed area, was measured. Using this standard silver composition, the time required for leaching was 65 seconds, for either substrate.

EXAMPLE 2

As a further comparative example, using the compositions of U.S. Pat. No. 3,679,439, a composition similar to that of Example 1 was formulated with 3% lead powder added to the composition, with no change other than reduction in the amount of vehicle to compensate for the lead addition (6% lead based on silver). The times required to leach the silver from the ceramic wafers were, for barium titanate, 85 seconds and for titanium oxide, 140 seconds. This represents 130 and 215%, respectively of the performance of the comparative material of Example 1.

EXAMPLE 3

A bismuth-silver coprecipitate powder was prepared by mixing silver nitrate and bismuth nitrate aqueous solutions in such a ratio as to produce 90% silver, 10% bismuth.

The solution was prepared from 25 ml. of an aqueous silver nitrate solution containing 900 g. silver metal equivalent per liter (22.5 g. of silver), 3.0 g. bismuth oxinitrate (2.2 g. Bi), and 5 ml. water. A reductant solution was prepared using 50 ml. water and 21 g. sodium carbonate. The reductant solution was added slowly to the Ag/Bi solution, with stirring to precipitate mixed carbonates of silver and bismuth; 9 ml. of 37% formaldehyde was then added. Frothing occurred, the suspension became very dark in color, and the pH (by test paper) became acidic. An additional 5 g. of sodium carbonate was added to make the suspension alkaline, and the precipitated metal was filtered off, washed, and dried.

A composition of the resulting silver-bismuth coprecipitate was prepared as in Example 1, printed, and fired on capacitor wafers and tested for solder leach resistance with the following results: On barium titanate wafers, leaching occurred in 150 seconds and on titania wafers in 280 seconds. This represents 230% and 430%, respectively of the performance of the comparative material of Example 1, for this composition of 12% bismuth, based on silver. Solderability was observed to be good in this Example 3.

EXAMPLES 4 and 5

In a similar series of experiments using a higher solder pot temperature (220°C.), two compositions were compared. Fired products prepared as in Example 1 (no additive) leached in 28 seconds. Fired products prepared using 5% bismuth powder based on Ag (not a coprecipitate) leached in 39 seconds, 140% of the standard even at this higher temperature. Solderability was observed to be good.

I claim:

1. In compositions comprising finely divided silver and inorganic binder, useful for producing conductive patterns on a dielectric substrate, improved compositions additionally comprising bismuth as finely divided elemental bismuth powder or as finely divided silver/-bismuth coprecipitate powder, the amount of bismuth being an amount effective to increase the solder leach resistance of conductors thereof.

2. Conductor compositions wherein the amount of bismuth is 2–20% by weight, based on the weight of silver.

3. Conductor compositions according to claim 1 wherein bismuth is finely divided elemental bismuth powder.

4. Conductor compositions according to claim 1 wherein bismuth is finely divided Ag/Bi coprecipitate powder.

5. Conductor compositions according to claim 1 dispersed in an inert vehicle.

6. Conductor compositions according to claim 2 dispersed in an inert vehicle.

7. Conductor compositions according to claim 3 dispersed in an inert vehicle.

8. Conductor compositions according to claim 4 dispersed in an inert vehicle.

* * * * *